United States Patent [19]
Qureshi et al.

[11] Patent Number: 5,793,776
[45] Date of Patent: Aug. 11, 1998

[54] STRUCTURE AND METHOD FOR SDRAM DYNAMIC SELF REFRESH ENTRY AND EXIT USING JTAG

[75] Inventors: Amjad Qureshi, San Jose; Sanghyeon Baeg, Cupertino, both of Calif.

[73] Assignee: Samsung Electronics Co., Ltd., Seoul, Rep. of Korea

[21] Appl. No.: 733,817

[22] Filed: Oct. 18, 1996

[51] Int. Cl.⁶ .................................................. G01R 31/28
[52] U.S. Cl. ........................................ 371/22.1; 395/183.18
[58] Field of Search ................................. 371/22.1, 21.1, 371/22.31, 22.32, 22.5, 42; 365/201, 222, 189.01, 233; 395/881, 285, 183.06, 183.18; 324/765

[56] References Cited

U.S. PATENT DOCUMENTS

| | | | |
|---|---|---|---|
| 4,807,196 | 2/1989 | Mizukami | 365/222 |
| 4,860,290 | 8/1989 | Daniels et al. | 371/25 |
| 5,228,045 | 7/1993 | Chiles | 371/22.3 |
| 5,313,470 | 5/1994 | Simpson | 371/22.3 |
| 5,317,712 | 5/1994 | Peek et al. | 395/425 |
| 5,321,661 | 6/1994 | Iwakiri et al. | 365/222 |
| 5,329,471 | 7/1994 | Swoboda et al. | 364/578 |
| 5,428,623 | 6/1995 | Rahman et al. | 371/22.3 |
| 5,432,747 | 7/1995 | Fuller et al. | 365/203 |
| 5,434,804 | 7/1995 | Bock et al. | 364/579 |
| 5,450,364 | 9/1995 | Stephens, Jr. et al. | 365/222 |
| 5,479,652 | 12/1995 | Dreyer et al. | 395/183.06 |
| 5,488,688 | 1/1996 | Gonzales et al. | 395/183.1 |
| 5,497,378 | 3/1996 | Amini et al. | 371/22.3 |
| 5,510,704 | 4/1996 | Parker et al. | 324/158.1 |
| 5,519,715 | 5/1996 | Hao et al. | 371/22.3 |
| 5,524,114 | 6/1996 | Peng | 371/22.1 |
| 5,535,331 | 7/1996 | Swoboda et al. | 395/183.21 |
| 5,546,568 | 8/1996 | Bland et al. | 395/550 |
| 5,566,117 | 10/1996 | Okamura et al. | 365/222 |
| 5,568,437 | 10/1996 | Jamal | 365/201 |
| 5,570,381 | 10/1996 | Schofield | 371/61 |
| 5,608,736 | 3/1997 | Bradford et al. | 371/22.3 |
| 5,614,838 | 3/1997 | Jaber et al. | 324/765 |
| 5,623,503 | 4/1997 | Rutkowski | 371/22.3 |

OTHER PUBLICATIONS

Texas Instruments, Boundary–Scan Architecture and IEEE Std. 1149.1 (from Chapter 3 of TI's IEEE 1149.1 Testability Primer, SSYA002B) (Nov. 1996).

IEEE Computer Society, "IEEE Standard Test Access Port and Boundary–Scan Architecture", Published by the Institute of Electrical and Electronics Engineers, Inc. (1990), including 1149.1a (Oct. 21, 1993) and 1149.1b (Mar. 1, 1995).

Maunder and Tulloss, "The Test Access Port and Boundary–Scan Architecture", Published by the IEEE Computer Society Press, Los Alamitos, California (1990).

*Primary Examiner*—Robert W. Beausoliel, Jr.
*Assistant Examiner*—Nadeem Iqbal
*Attorney, Agent, or Firm*—Skjerven, Morrill, MacPherson, Franklin & Friel, LLP; David T. Millers

[57] ABSTRACT

JTAG test logic and a memory controller place an SDRAM in a self refresh mode prior to beginning JTAG testing. The memory controller can complete a current memory access and otherwise prepare for the JTAG test. During the JTAG test, self refresh mode operation of the SDRAM retains data without the need for a clock signal or refresh signals which are suspended for the JTAG test. Accordingly, after the JTAG test, circuit operation can continue without reinitializing data in the SDRAM.

16 Claims, 6 Drawing Sheets

STRUCTURE AND METHOD FOR SDRAM DYNAMIC SELF REFRESH ENTRY AND EXIT USING JTAG

CROSS-REFERENCE TO RELATED APPLICATIONS

This application relates to copending applications Ser. No. 08/733,132, filed on the same day, entitled "ADAPTABLE SCAN CHAINS FOR DEBUGGING AND MANUFACTURING TEST PURPOSES", by Baeg, and Ser. No. 09/733,908, filed on the same day, entitled "CLOCK GENERATION FOR TESTING OF INTEGRATED CIRCUITS", by Baeg and Yu, both owned by the assignee of this application and incorporated herein by reference.

COPYRIGHT NOTICE

A portion of the disclosure of this patent document contains material which is subject to copyright protection. The copyright owner has no objection to facsimile reproduction by anyone of the patent document or the patent disclosure, as it appears in the Patent and Trademark Office patent file or records, but otherwise reserves all copyright rights whatsoever.

BACKGROUND OF INVENTION

A recent development in integrated circuit testing is the use of the JTAG (Joint Test Action Group) test port for in situ testing of integrated circuit chips mounted on a board. This standard has been adopted by the Institute of Electrical and Electronics Engineers and is now defined as IEEE Standard 1149.1, IEEE Standard Test Access Port and Boundary-Scan Architecture, which is incorporated herein by reference. The IEEE standard 1149.1 is explained in "The Test Access Port and Boundary-Scan Architecture" (IEEE Computer Society Press, 1990) which is also incorporated herein by reference.

In the JTAG scheme, a four (or optional five) signal Test Access Port (TAP) is added to each chip or grouping of chips on a board. The TAP includes four inputs: a test clock (TCK), a test mode select (TMS), a test data in (TDI), and an optional test reset (TRSTN). In addition, there is one output, a test data output (TDO). TDI and TDO are daisy-chained from chip to chip, whereas TCK and TMS are broadcast.

The TCK input is independent of the system clocks for the chip so that test operations can be synchronized between different chips. The operation of the test logic is controlled by the sequence of signals applied at the TMS input. The TDI and TDO are serial data input and output, respectively while TRSTN input is used to intitialize a chip or circuit to a known state. JTAG testing may be used to test suitably configured integrated circuits to verify operability. However, conventional JTAG testing may require initializing memory and control logic after each JTAG test procedure since the storage cells of SDRAM need to be refreshed periodically (for example, every 64 ms) or the stored information is lost. This means all pre-existing memory data is lost and operation cannot be resumed at the point just prior to JTAG testing.

SUMMARY OF INVENTION

In accordance with this invention, memory such as SDRAMs are put into self refresh mode while JTAG testing is performed. Self refresh is a refresh mode available in some memory and is preferred for data retention and low power operation. For an SDRAM in self refresh mode, the SDRAM disables the system clock and all input buffers except CKE (clock enable).

A JTAG Logic is used in accordance with this invention to asynchronously communicate with a Memory Controller Unit to allow the stopping of system clocks while preserving the contents of SDRAM using the self refresh mode. The Memory Controller Unit does not permit the system clocks to be stopped by the JTAG Logic for testing until the Memory Controller Unit has finished the current memory access operation. Prior to the stopping of the system clocks, the Memory Controller Unit places the SDRAM into self refresh mode to preserve the memory contents.

In accordance with one embodiment of this invention, the JTAG Logic includes a JTAG Controller that is connected to a set of control registers that provide an interface to the Memory Controller Unit. The control registers are necessary for the communication of signals between the JTAG Controller and the Memory Controller Unit because the two Controllers operate at different clock frequencies (for example, the JTAG Controller operates at 10 MHz and the Memory Controller Unit operates at 80 MHz).

In one embodiment in accordance with this invention, when the JTAG Controller wants to stop the system clock to allow testing to commence, a signal jtag_clk_stop_req high is asserted and communicated via a Memory Control Register to a Self-Refresh State Machine which is part of the Memory Controller Unit. The Self-Refresh State Machine asserts the signal jtag_clk_stop_request high to a Memory Controller State Machine which finishes the current memory access operation before asserting a signal mcu_idle high back to the Self-Refresh State Machine. On assertion of the signal mcu_idle high by the Memory Controller State Machine and the presence of signal jtag_clk_stop_req high, the Self-Refresh State Machine places the SDRAM into self refresh mode. The Self-Refresh State Machine also asserts the signal mcu_idle high to an Observation Control Register which is continually scanned by the JTAG Controller. If the JTAG Controller detects the signal mcu_idle high and the signal jtag_clk_stop$_{13}$ req high, a signal sys$_{13}$ clk_bypass high is asserted by the JTAG Controller. The signal sys_clk_bypass high is asserted to a System Clock Generator Block via the Memory Control Register and causes the system clock to be bypassed.

Once the system clock has been bypassed, testing can begin and the contents of the SDRAM are preserved through the use of the SDRAM self refresh mode. When testing is complete, the JATAG controller asserts a signal jtag_sdram_norm high to the Self-Refresh State Machine via the Memory Control Register which causes the SDRAM to be taken out of self refresh mode. The JTAG Controller also removes the bypass of the system clock by asserting the signal sys_clk_bypass low via the Memory Control Register.

The ability to dynamically enter and exit SDRAM self refresh before and after testing, respectively, using the JTAG Logic saves debugging time. Memory and control logic do not need to be initialized after testing has taken place.

DETAILED DESCRIPTION OF INVENTION

Self refresh mode is implemented in some volatile memories such as SDRAMs. Putting such memories in self refresh mode allows the stopping of all clocks, including the SDRAM clock without loss of the stored information. An SDRAM, part NO. KM41651120A available from Samsung Electronics, Ltd. is an example of a memory having a self refresh mode. Using the SDRAM self refresh mode during JTAG testing allows dynamic stopping of clocks, proceeding with JTAG testing, and resuming operations with memory contents preserved.

Figure 1:
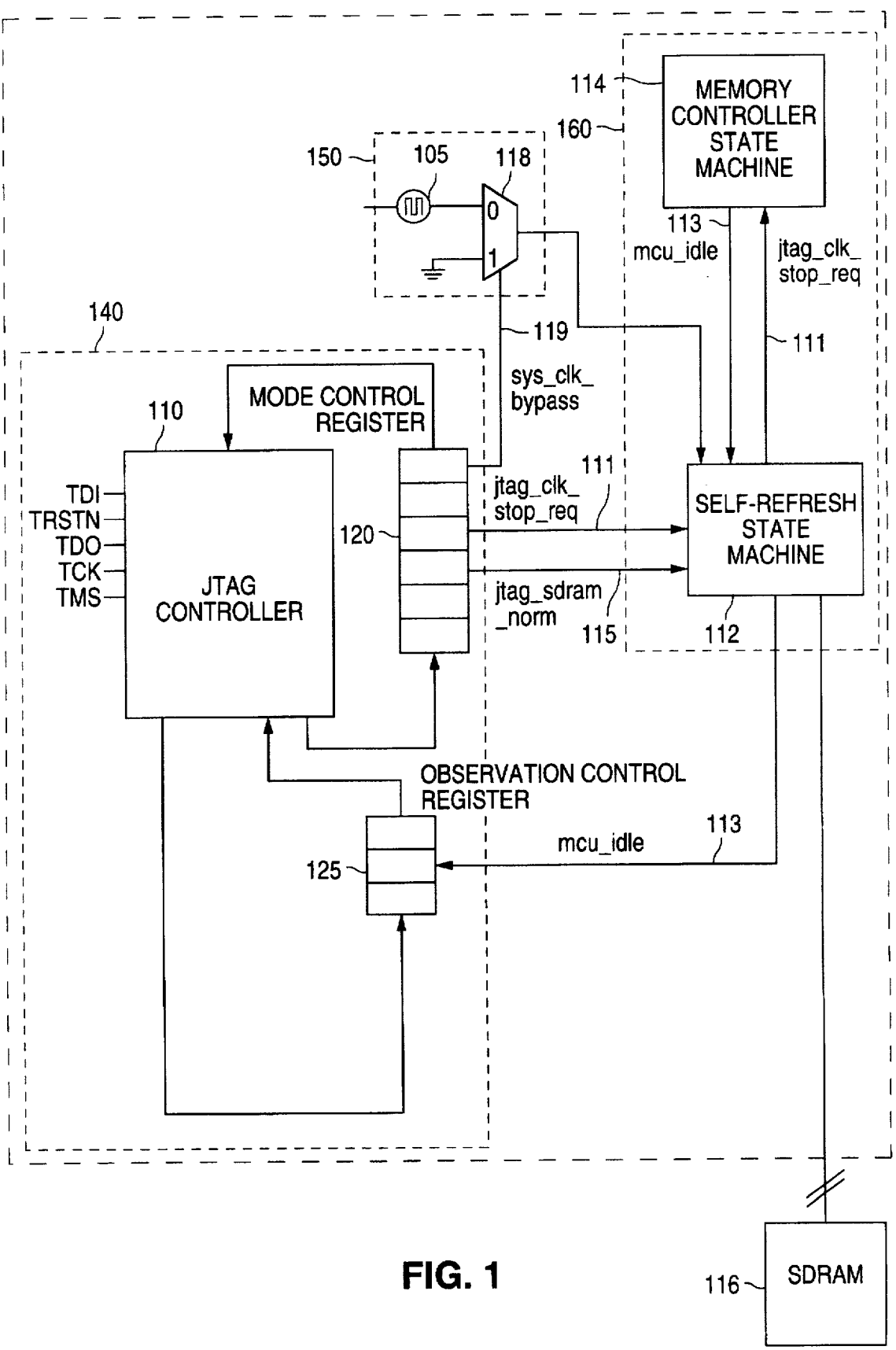
FIG. 1 shows JTAG logic interfaced to a memory controller unit in accordance with this invention.

In accordance with this invention as shown in FIG. 1, JTAG Logic 140 implemements extensions of the JTAG standard. Two special shift registers, a Mode Control Register (MCR) 120 and an Observation Control Register (OCR) 125 are controlled by standard JTAG Controller 110. Shift registers MCR 120 and OCR 125 are used between a JTAG Controller 110 and the non-test circuitry because JTAG Controller 110 operates at a lower clock speed than the non-test circuitry. For example, in one embodiment, JTAG Controller 110 runs at a 10 MHz clock while the non-test circuitry operates at 80 MHz. Synchronization problems between JTAG Controller 110 and the non-test circuitry are avoided through the use of the two shift registers, MCR 120 and OCR 125.

In one embodiment, Mode Control Register 120 holds 40 instruction values while Observation Control Register 125 holds 70 status values (Further details concerning one embodiment of JTAG Logic 140 are presented in Appendix A-B, incorporated by reference and available in the file,in particular Appendix B includes Verilog code for the test circuitry). Instructions are serially shifted into MCR 120 from JTAG Controller 110 to control the internal logic of an integrated circuit. For example, in one embodiment the circuit is a multimedia signal processor system. JTAG Controller 110 serially shifts values out of OCR 125 to observe the status of the internal logic of the circuit. Shift registers MCR 120 and OCR 125 are special shift registers consisting of a plurality of register cells where data can be serially shifted through each register cell without destroying the existing contents of that register cell. The register cell used in an exemplary embodiment is a standard ASIC register cell described in Samsung ASIC Standard Cell Library Data Book SEC STD60 which is incorporated herein by reference.

Figure 3:
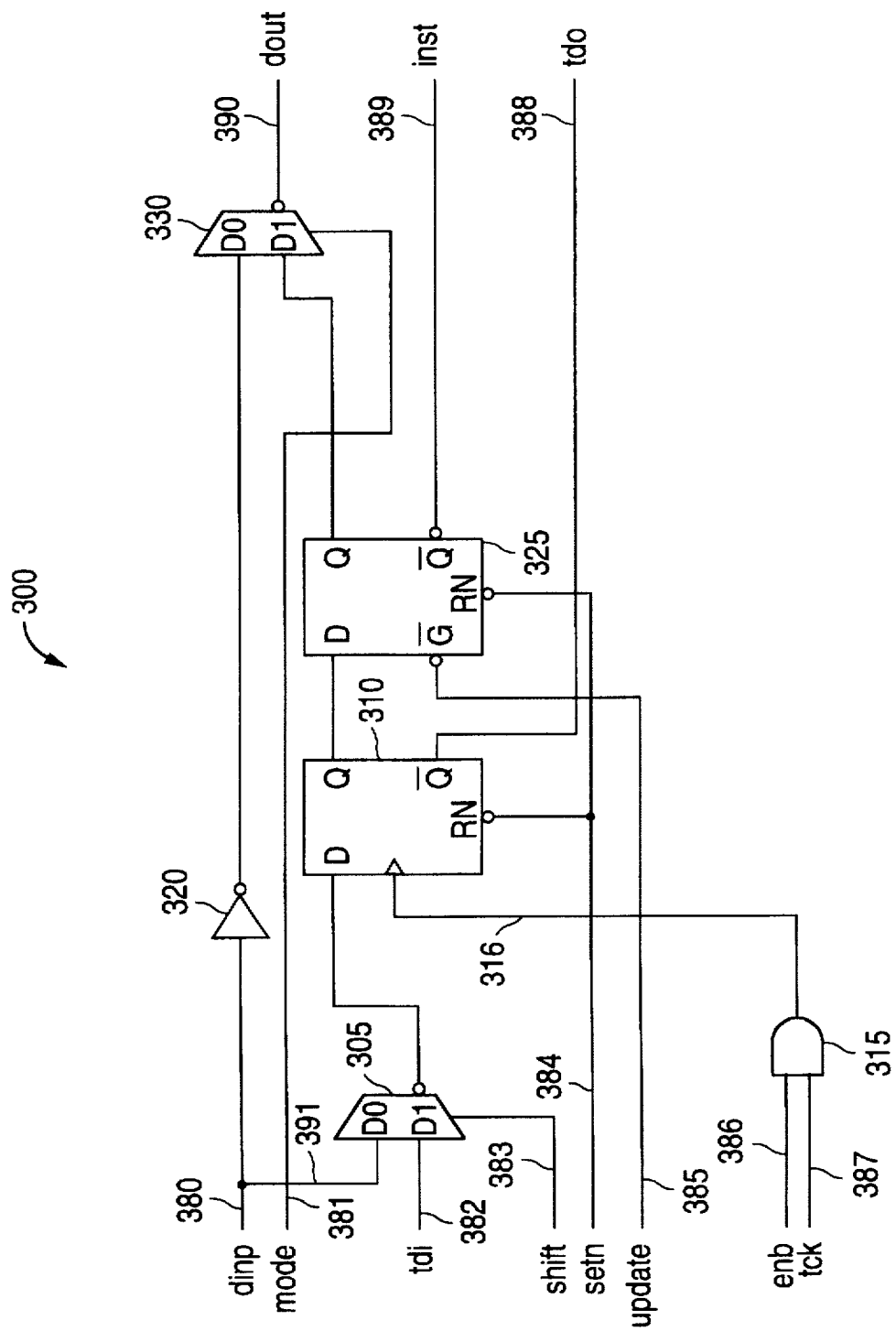
FIG. 3 shows a register cell in accordance with an embodiment of this invention.

FIG. 3 shows a schematic of a register cell 300 which can transmit an input signal dinp with or without storing the value of signal dinp in flipflop 310. In register cell 300, input signal dinp is input through multiplexer 305 to flipflop 310 through an invertor 320 and multiplexer 330 as an output signal dout.

Multiplexer 305 selects either a signal tdi on or signal dinp depending on whether a signal shift is high or low respectively. The use of flipflop 310 and latch 325 allows data to be shifted into flipflop 310 while latch 325 preserves an output signal inst. Multiplexer 330 selects whether output signal dout is from latch 325 or input signal dinp.

If the signal tdi is selected by multiplexer 305, data (tdi) may be shifted through register cell 300 by shifting data into flipflop 310 while a signal update on lead 385 coupled to latch 325 remains high. Latch 325 retains the previously latched data on terminal Q of latch 325. An output signal tdo from flipflop 310 is input into an identical adjoining register cell 430 (see FIG. 4) as the signal tdi at a clock edge if the clock signal tck is enabled by AND gate 315 and signal enb. Clock signal tck and the signal enb input to AND gate 315 which is coupled to the clock terminal of flipflop 310.

To change output signal inst from register cell 300, signal update is asserted low which causes latch 325 to latch the output signal from flipflop 310 so that new value inst is now provided by register cell 300. Signal inst is the content of register cell 300 which is output to, for example, Self-Refresh State Machine 112.

Figure 4:
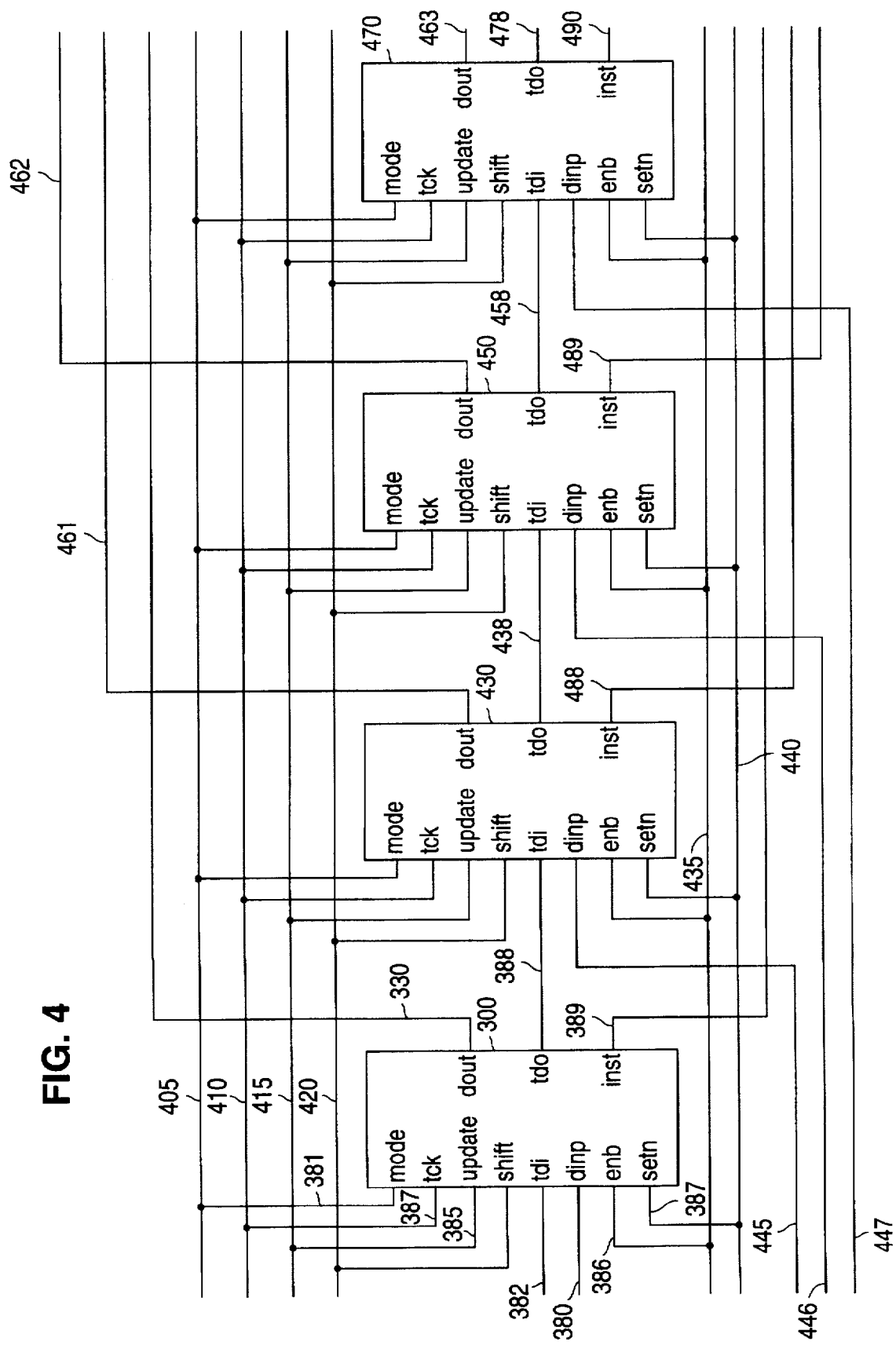
FIG. 4 shows a set of register cells configured as a register in accordance with an embodiment of this invention.

FIG. 4 shows how register cell 300 (shown in detail in FIG. 3) is coupled together with other register cells in one embodiment of a register such as MCR 120 or OCR 125. Four register cells of a register are shown in FIG. 4, and the interconnect scheme can be repeated to produce a register of the desired size. The signals mode, tck, update, shift, enb, and setn are on leads 405, 410, 415, 420, 435, and 440, respectively, and couple to register cells 300, 430, 450, and 470 in parallel.

Data input signals dinp from JTAG Logic 140 couple to register cells 300, 430, 450, and 470 on separate input leads 380, 445, 446, and 447, respectively. The data output signals dout from register cells 300, 430, 450, and 470 couple on separate leads 330, 461, 462, and 463, respectively, to JTAG logic 140.

The signals inst from register cells 300, 430, 450, and 470 on leads 389, 488, 489, and 490, respectively, are coupled to desired locations in JTAG Logic 140 or other parts of the circuitry. For example, in one embodiment, two register cells of MCR 120 provide the signals inst, jtag_clk_stop_req on lead 111 and jtag_sdram_norm, on lead 115 to Self-Refresh State Machine 112. Similarly, a register cell in OCR 125 provides the signals inst and mcu_idle, to JTAG Controller 110.

Data serially shifted through register cells 300, 430, 450, and 470 is labeled as signal tdi when going into one of register cells 300, 430, 450, and 470 and labled as signal tdo when coming out of one of register cells 300, 430, 450, and 470.

When entering JTAG test mode, JTAG Logic 140 asserts a clock stop request signal (jtag_clk_stop_req on lead 111) high to Memory Control Unit 160 of FIG. 1. Signal jtag_clk_stop_req high on lead 111 passes to Self-Refresh State Machine 112 which the asserts signal jtag_clk_stop_req high on lead 111 coupled to Memory Controller State Machine 114. Self-Refresh State Machine 112 does not put SDRAMs 116 into self refresh mode until Memory Controller State Machine 114 is in an IDLE state and Memory Controller State Machine 114 asserts a signal mc_idle high on lead 113. The state signal mcu_idle from Memory Controller State Machine 114 is input into shift register OCR 125 and shifted out to be observed by JTAG Controller 110. Once Memory Controller State Machine 114 has finished the current memory access operation and signal jtag_clk_stop_req is asserted high, all remaining memory access requests are disregarded by Memory Controller State Machine 114.

On assertion of the signal mcu_idle high with a pending clock-stop request, Self-Refresh State Machine 112 initiates a self refresh command to SDRAMs 116. Once a self refresh command has been asserted on SDRAMs 116, the signal mc_idle high is asserted by Self-Refresh State Machine 112 on lead 113 to OCR 125. A few clock cycles after assertion of the signal mc_idle high on lead 113, System Clock Generator Block 150 to the logic and SDRAMs 116 will be bypassed for JTAG testing. To bypass system clock 105, the signal sys_clk_bypass high is shifted into a particular register cell of MCR 120. Lead 119 is coupled to synchronous multiplexer 118 and the assertion of signal sys_clk_bypass high on lead 119 disables output from system clock 105. Before switching to input "1" on assertion of the signal sys_clk_bypass high on lead 119 synchronous multiplexer 118 waits for a rising clock edge to ensure maintenance of proper synchronization.

During testing, SDRAMs 116 are maintained in self refresh mode to retain stored data. Once JTAG testing is complete, JTAG Controller 110 asserts the signal jtag_sdram_norm high on lead 115 which causes Self-Refresh State Machine 112 to take SDRAMs 116 out of self refresh mode and deasserts signal sys_clk_bypass. Once SDRAMs 116 are out of self refresh mode, and all the system clocks are active, Memory Controller State Machine 114 resumes processing memory access requests that were pending prior to the start of JTAG testing.

Figure 2:
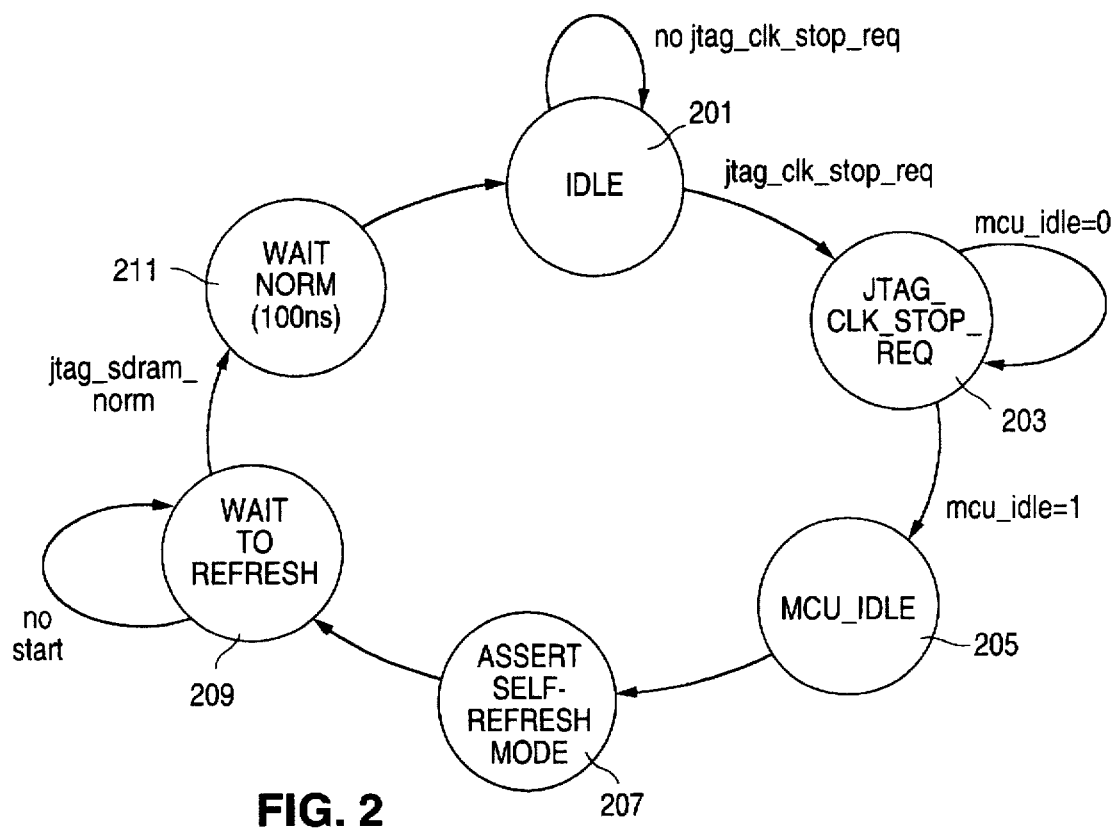
FIG. 2 shows a state diagram of a Self-Refresh State Machine in accordance with an embodiment of this invention.
Figure 7:
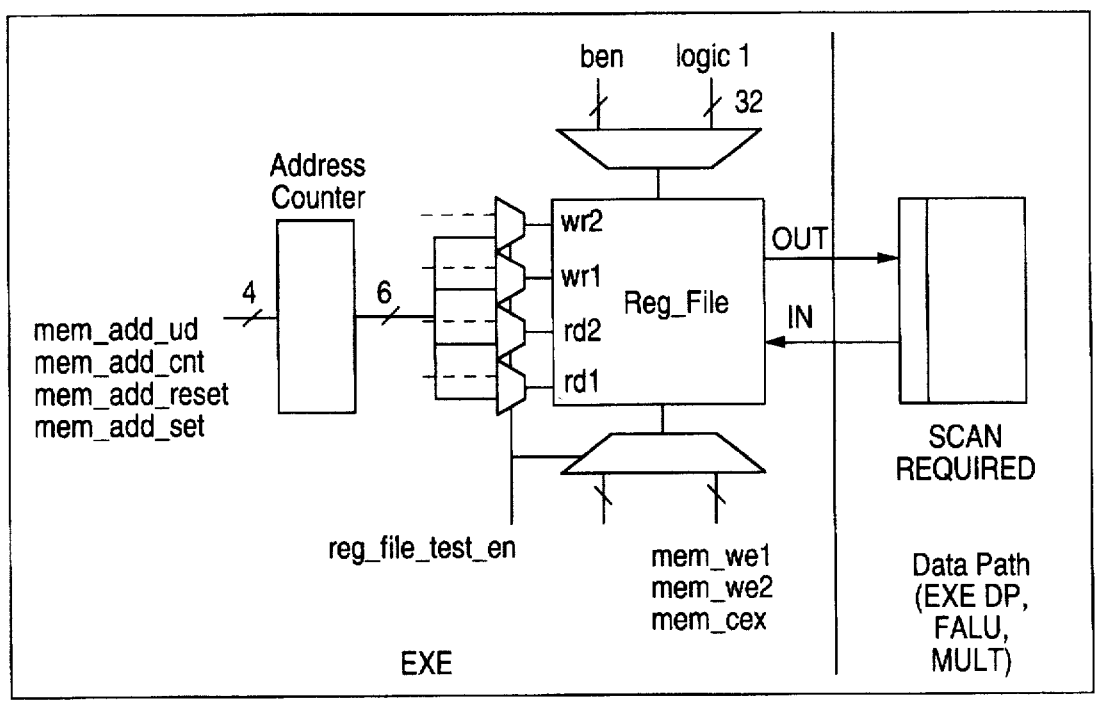
FIGS. 6 and 7 illustrate test schemes according to the present invention.

FIG. 2 shows a state diagram for an embodiment of Self-Refresh State Machine 112. Initially, Self-Refresh State Machine 112 is in state IDLE 201 if the signal jtag_clk_stop_req high is not asserted. If the signal jtag_clk_stop_req high is asserted, Self-Refresh State Machine 112 enters state JTAG_CLK_STOP_REQ 203, asserts signal jtag_clk_stop_req to Memory Controller State Machine 114, and waits until signal mcu_idle high is asserted, indicating that Memory Controller State Machine 114 has completed the current memory access. When the signal mcu_idle is asserted, Self-Refresh State Machine 112 enters state MCU_IDLE 205 which asserts the signal mcu_idle high on lead 113 to OCR 125. JTAG Controller 110 constantly shifts the contents of OCR 125 to determine the state of the internal logic and initiates testing once the signal mcu_idle high on lead 113 has been shifted in from OCR 125.

Self-Refresh State Machine 112 enters state ASSERT SELF REFRESH MODE 207 and in an exemplary embodiment where SDRAMs 116 are 16M SDRAMs available from Samsung (part nos. KM44S4020A, KM48S2020A, or KM416S1120A, see Samsung Data Book "16M Synchronous DRAM", March 1996 which is incorporated herein by reference), Self-Refresh State Machine 112 asserts low on pins CS (chip select), RAS (row address strobe), CAS (column address strobe) and CKE (clock enable) with high on WE (write enable) to put SDRAM 116 into self refresh. Once the self refresh mode is entered, SDRAM 116 ignores all inputs other than a CKE (clock enable) pin while in self refresh state.

Self-Refresh State Machine 112 is in state WAIT TO REFRESH 209 until the signal jtag_sdram_norm from MCR 120 is high. On receipt of the signal jtag_sdram_norm high on lead 115, Self-Refresh State Machine 112 exits self refresh mode and enters state WAIT NORM 211. In the exemplary embodiment, exit from self refresh mode is accomplished by removing the bypass of system clock 105 by asserting the signal sys_clock_bypass low on lead 119 coupled to synchronous multiplexer 118 and then asserting high on the CKE inputs of SDRAMs 116. In state WAIT NORM 211, a NOP (no operation signal) is asserted for a minimum of 100 ns on SDRAMs 116 to allow SDRAMs 116 to reach idle state. After assertion of signal NOP for 100 ns, Self-Refresh State Machine 112 returns to state IDLE 201.

Figure 5:
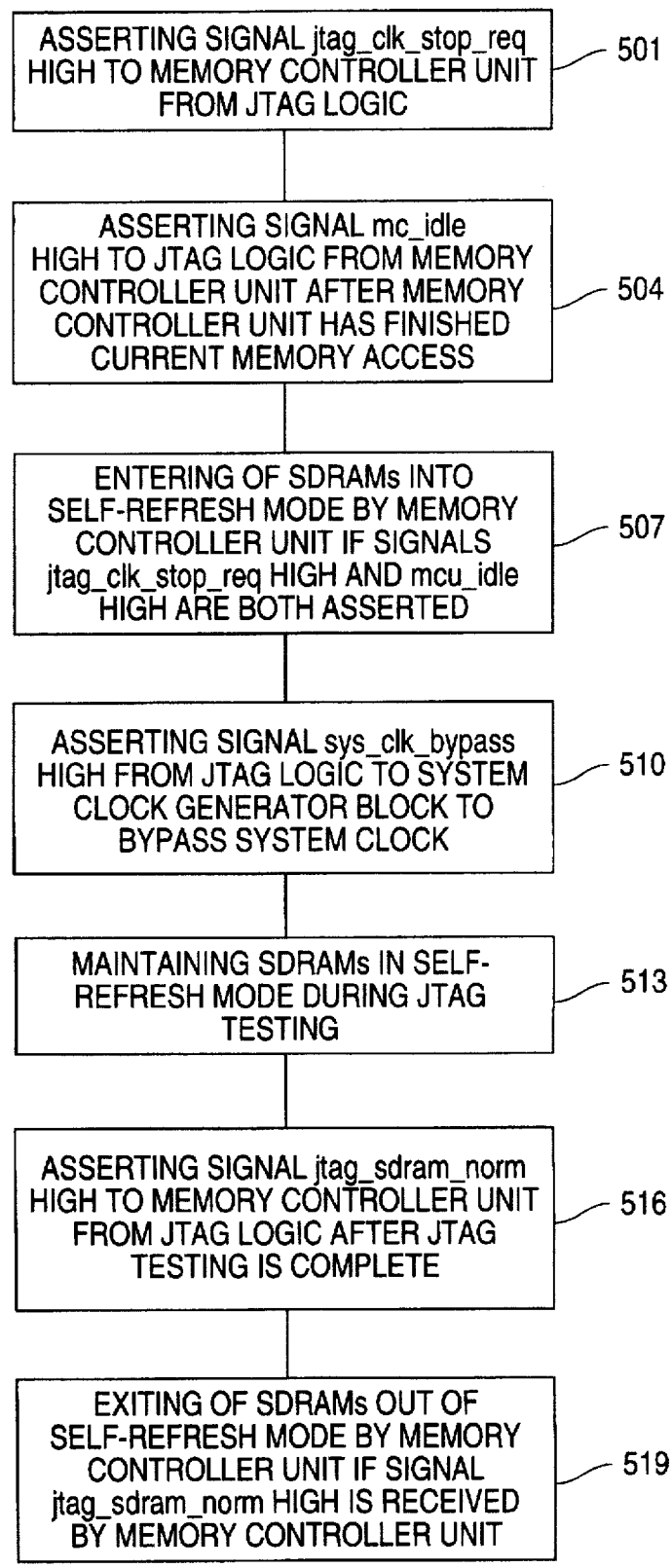
FIG. 5 shows a method for SDRAM dynamic self refresh entry and exit using JTAG in accordance with this invention.
Figure 6:
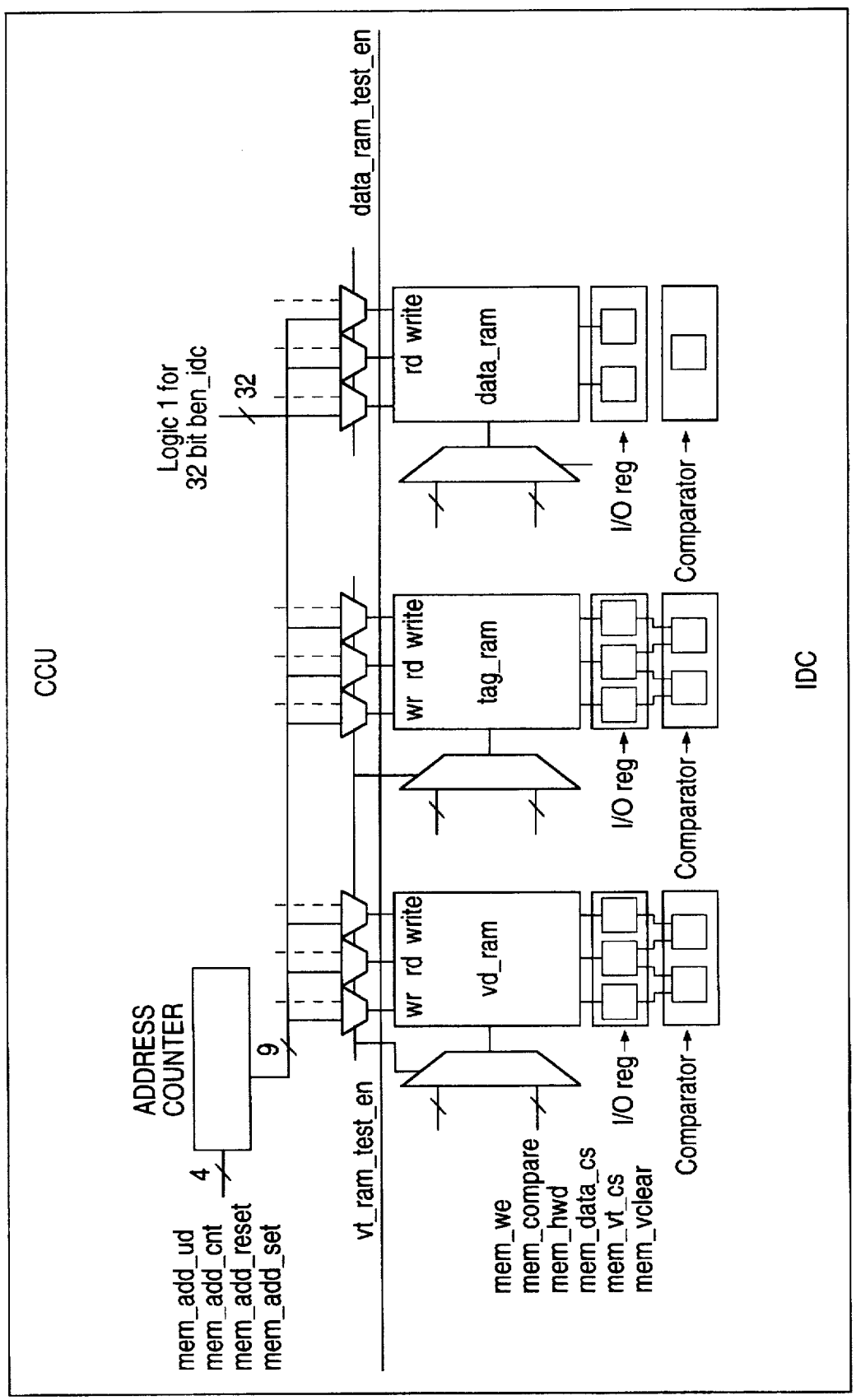

FIG. 5 shows a method for SDRAM dynamic self refresh entry and exit using JTAG in accordance with this invention.

Each block represents a step in the method. Block 501 is the step of asserting signal jtag_clk_stop_req high by JTAG Logic 140 to Memory Controller Unit 160. Block 504 is the step of asserting signal mc_idle high by Memory Controller Unit 160 to JTAG Logic 140 once Memory Controller Unit 160 has completed the current memory access operation. Block 507 is the step of Memory Controller Unit 160 placing SDRAMs 116 into self refresh mode if the signals jtag_clk_stop_req and mcu_idle are both asserted. Block 510 is the step of asserting a signal sys_clk_bypass high from JTAG Logic 140 to system clock generator 150 to bypass system clock 105. Block 513 is the step of maintaining SDRAMs 116 in self refresh mode during JTAG testing. Block 516 is the step of asserting a signal jtag_sdram_norm high to Memory Controller Unit 160 from JTAG Logic 140 after JTAG testing has been completed. Block 519 is the step of Memory Controller Unit 160 taking SDRAMs 116 out of self refresh mode if signal jtag_sdram_norm high is received by Memory Controller Unit 160.

Restarting logic and SDRAMS 116 at the point of shutdown allows dynamic stopping of all clocks, proceeding with JTAG testing, and resuming operation. Hence, memory and control logic need not be initialized each time JTAG testing is performed and less memory initializations are required saving time during the debugging procedure.

The various embodiments of the structure and method of this invention that are described above are illustrative only of the principles of this invention and are not intended to limit the scope of the invention to the particular embodiments described. Many additional and alternative embodiments are in the scope of this invention as defined by the following claims.

We claim:

1. A circuit test method comprising:
    asserting a first signal to a memory controller unit from a test logic circuit to indicate a start of the circuit test;
    asserting a second signal from said memory controller unit to said test logic circuit to indicate that said memory controller unit has finished the current memory access;
    placing of a dynamic memory coupled to said memory controller unit into a self refresh mode in response to both said first signal and said second signal being asserted; and
    testing a circuit while said dynamic memory is in said self refresh mode, said self-refresh mode being used to preserve pretest contents of said dynamic memory during said testing.

2. The method of claim 1, wherein testing disables a clock signal used by said dynamic memory when in an operating mode.

3. The method of claim 1 wherein testing stops a refresh signal to said dynamic memory.

4. The method of claim 1, further comprising asserting a third signal from said test logic circuit to a system clock generator block, said third signal causing a bypass of said system clock generator block.

5. The method of claim 4, further comprising:
    asserting a fourth signal to said memory controller unit from said test logic circuit to indicate that said circuit test is complete; and
    taking of said dynamic memory out of self refresh mode by said memory controller unit if said fourth signal is asserted.

6. A circuit comprising:
    a memory controller;

a test logic coupled to said memory controller wherein prior to a circuit test, said test logic asserts a first signal that indicates to said memory controller that a system clock bypass is being requested and said memory controller asserts a second signal to said test logic when a current memory access operation is complete; and a dynamic memory capable of operating in self refresh mode coupled to said memory controller, wherein said memory controller places said dynamic memory into said self refresh mode in response to said first signal and said second signal being asserted, said self refresh mode being used to preserve pretest contents of said dynamic memory during said circuit test.

7. The circuit of claim 6, further comprising a system clock generator block coupled to said test logic circuit, wherein said test logic circuit asserts a third signal prior to said circuit test to bypass said system clock generator block.

8. The circuit of claim 6, wherein said dynamic memory is an SDRAM.

9. The circuit of claim 6, wherein said test logic comprises:

a test controller; and a set of shift registers coupled to both said memory controller and said test controller to allow for communication between said test controller and said memory controller.

10. The circuit of claim 9, wherein said test controller is a JTAG Controller.

11. The circuit of claim 9, wherein said set of shift registers comprise:

a Mode Control Register for holding instruction values; and an Observation Control Register for holding status values.

12. The circuit of claim 11, wherein said Mode Control Register comprises a plurality of register cells through which data can be serially shifted without destroying the existing contents of each of said plurality of register cells.

13. The circuit of claim 11, wherein said Observation Control Register comprises a plurality of register cells through which data can be serially shifted without destroying the existing contents of each of said plurality of register cells.

14. The circuit of claim 6 wherein said circuit comprises an integrated circuit.

15. The circuit of claim 14 wherein said integrated circuit is a multimedia signal processor system.

16. The method of claim 1 wherein said circuit is a logic circuit.

* * * * *